United States Patent
Lee et al.

(10) Patent No.: US 12,532,697 B2
(45) Date of Patent: Jan. 20, 2026

(54) ETCHING DEVICE AND ETCHING METHOD THEREOF

(71) Applicant: ZEUS CO., LTD., Hwaseong-si (KR)

(72) Inventors: Seung Hoon Lee, Hwaseong-si (KR); Sung Won Mo, Hwaseong-si (KR); Yang Ho Lee, Osan-si (KR); Jeong Hyun Bae, Hwaseong-si (KR); Seong Hwan Park, Cheongju-si (KR); Hyun Dong Cho, Sejong-si (KR)

(73) Assignee: ZEUS CO., LTD., Hwaseong-si (KR)

( * ) Notice: Subject to any disclaimer, the term of this patent is extended or adjusted under 35 U.S.C. 154(b) by 924 days.

(21) Appl. No.: 17/432,343

(22) PCT Filed: Apr. 22, 2020

(86) PCT No.: PCT/KR2020/005303
§ 371 (c)(1),
(2) Date: Feb. 15, 2022

(87) PCT Pub. No.: WO2020/218815
PCT Pub. Date: Oct. 29, 2020

(65) Prior Publication Data
US 2022/0189796 A1    Jun. 16, 2022

(30) Foreign Application Priority Data
Apr. 23, 2019    (KR) .................. 10-2019-0047050

(51) Int. Cl.
*H01L 21/67* (2006.01)
*B08B 3/04* (2006.01)
(Continued)

(52) U.S. Cl.
CPC .......... *H01L 21/67063* (2013.01); *B08B 3/04* (2013.01); *C09K 13/04* (2013.01);
(Continued)

(58) Field of Classification Search
CPC ......... H01L 21/67063; H01L 21/31111; H01L 21/6704; H01L 21/67075; H01L 21/6708;
(Continued)

(56) References Cited

U.S. PATENT DOCUMENTS

| 7,578,886 B2 * | 8/2009 | Yamada | C23C 18/1628 134/21 |
| 2004/0065540 A1 * | 4/2004 | Mayer | H01L 21/32134 257/E21.309 |

(Continued)

FOREIGN PATENT DOCUMENTS

| CN | 103367203 | 10/2013 |
| CN | 103996598 | 8/2014 |

(Continued)

OTHER PUBLICATIONS

Translation of JP H07273078A (Year: 1995).*
(Continued)

*Primary Examiner* — Jeffrie R Lund
(74) *Attorney, Agent, or Firm* — KILE PARK REED & HOUTTEMAN PLLC

(57) ABSTRACT

The present invention relates to an etching device and an etching method thereof, the etching device comprising: an etchant supply unit for supplying an etchant to an etching chamber; a rinsing liquid supply unit for supplying a rinsing liquid to the etching chamber, a cleaning liquid supply unit for supplying a cleaning liquid to the etching chamber, and a first pressurization maintaining unit for maintaining at least one of the etching chamber and the etchant supply unit in a pressurized atmosphere.

10 Claims, 2 Drawing Sheets

(51) Int. Cl.
*C09K 13/04* (2006.01)
*H01L 21/311* (2006.01)
*H01L 21/673* (2006.01)
*H01L 21/677* (2006.01)

(52) U.S. Cl.
CPC .... *H01L 21/31111* (2013.01); *H01L 21/6704* (2013.01); *H01L 21/67075* (2013.01); *H01L 21/6708* (2013.01); *H01L 21/67086* (2013.01); *H01L 21/67373* (2013.01); *H01L 21/67739* (2013.01)

(58) Field of Classification Search
CPC ......... H01L 21/67086; H01L 21/67373; H01L 21/67739; H01L 21/6719; H01L 21/306; H01L 21/311; H01L 21/67028; H01L 21/67051; H01L 21/67126; H01L 21/68742; H01L 21/30604; H01L 21/6715; H01L 21/67248; B08B 3/04; C09K 13/04; C09K 13/06
See application file for complete search history.

(56) References Cited

U.S. PATENT DOCUMENTS

| | | | | |
|---|---|---|---|---|
| 2013/0260570 | A1* | 10/2013 | Masuhara | H01L 21/30604 |
| | | | | 156/345.23 |
| 2013/0260574 | A1* | 10/2013 | Masuhara | H01L 21/02019 |
| | | | | 438/782 |
| 2014/0227883 | A1* | 8/2014 | Izumoto | H01L 21/67028 |
| | | | | 156/345.37 |
| 2022/0108897 | A1* | 4/2022 | Lee | B08B 3/04 |
| 2022/0189796 | A1* | 6/2022 | Lee | H01L 21/311 |

FOREIGN PATENT DOCUMENTS

| | | | | |
|---|---|---|---|---|
| CN | 108305829 | | 7/2018 | |
| JP | 7-273078 | | 10/1995 | |
| JP | 2015-53333 | | 3/2015 | |
| JP | 2015053333 A | * | 3/2015 | |
| JP | 2023165121 A | * | 11/2023 | |
| KR | 10-0691479 | | 3/2007 | |
| KR | 100757849 B1 | * | 9/2007 | |
| KR | 10-2014-0102609 | | 8/2014 | |
| KR | 10-2017-0039360 | | 4/2017 | |
| KR | 10-2018-0126645 | | 11/2018 | |
| TW | 202220076 A | * | 5/2022 | ......... B05C 11/1015 |
| WO | WO-2009114964 A1 | * | 9/2009 | ....... H01L 21/67051 |

OTHER PUBLICATIONS

International Search Report, with English translation, for International Application No. PCT/KR2020/005303, dated Jul. 29, 2020.
Written Opinion, with English translation, for International Application No. PCT/KR2020/005303, dated Jul. 29, 2020.

* cited by examiner

ETCHING DEVICE AND ETCHING METHOD THEREOF

CROSS-REFERENCE TO RELATED APPLICATION(S)

This application is a national entry of International Application No. PCT/KR2020/005303, filed on Apr. 22, 2020, which claims under 35 U.S.C. § 119(a) and 365(b) priority to and benefits of Korean Patent Application No. 10-2019-0047050, filed on Apr. 23, 2019 in the Korean Intellectual Property Office, the entire contents of which are incorporated herein by reference.

TECHNICAL FIELD

The present invention relates to an etching device and an etching method thereof with improved etching performance.

BACKGROUND ART

A silicon nitride film is used as a representative insulating film in a semiconductor manufacturing process and has a structure in which the silicon nitride film is in contact with a silicon oxide film, a polysilicon film, a silicon object surface, or the like. Moreover, the silicon nitride film is deposited by a chemical vapor deposition (CVD) process and removed by dry etching and wet etching.

The dry etching is performed in a vacuum state mainly with a fluorine-based gas and an inert gas. However, there is a limit to commercial use because a device for performing the dry etching is expensive. Therefore, wet etching using phosphoric acid is widely used rather than the dry etching.

In the wet etching, a desired target layer is selectively etched from an object (substrate, or the like) by a chemical reaction of an etchant, and depending on required characteristics, an etching degree, or the like, an etchant having a composition ratio corresponding thereto may be easily mixed to perform the etching. Therefore, compared to the dry etching, it is possible to provide improved work compatibility and process many objects at once, and thus, the device is inexpensive.

However, in the wet etching, a portion of the etchant is vaporized during the etching, and thus, a temperature of the object may be lowered by heat of vaporization, it is difficult to control a concentration of the etchant due to the vaporization of the etchant, and a loss occurs. Accordingly, in order to keep the concentration of the etchant constant, currently, a large amount of deionized water and etchant are added to an etching tank to etch the object, and an economic loss is large due to the addition of a large amount of deionized water and etchant.

Therefore, a technology capable of preventing the vaporization of the etchant when the etching chamber is pressurized to keep the concentration of the etchant constant and remarkably improving a selectivity of a silicon nitride film with respect to a silicon oxide film is required.

As a prior document related to the present invention, there is Korean Patent No. 10-0691479 (Feb. 28, 2007), and the prior document discloses an etching device for a large-area substrate.

DISCLOSURE

Technical Problem

The present invention is directed to providing an etching device and an etching method thereof with improved etching performance.

Technical Solution

One aspect of the present invention provides an etching device including an etchant supply unit configured to supply an etchant to an etching chamber, a rinsing liquid supply unit configured to supply a rinsing liquid to the etching chamber, a cleaning liquid supply unit configured to supply a cleaning liquid to the etching chamber, and a first pressurization maintaining unit configured to maintain at least one of the etching chamber and the etchant supply unit in a pressurized atmosphere.

The etching device may further include a pressurization storage unit configured to accommodate at least one of the rinsing liquid and the cleaning liquid discharged from the etching chamber, and a second pressurization maintaining unit configured to maintain the pressurization storage unit in the pressurized atmosphere.

The etching device may further include a supply line connecting the etchant supply unit to the etching chamber, a circulation line connecting the supply line to the etchant supply unit, and a recovery line configured to supply the etchant discharged from the etching chamber to the etchant supply unit.

The etching device may further include a supply opening/closing unit configured to selectively open or close the supply line, a circulation opening/closing unit configured to selectively open or close the circulation line, and a recovery opening/closing unit configured to selectively open or close the recovery line.

The etchant supply unit may include a storage chamber in which the etchant is stored, a pumping unit provided in the supply line to move the etchant, and a temperature maintaining unit configured to maintain the etchant stored in the storage chamber at a set temperature.

The temperature maintaining unit may include a heater provided in the storage chamber, and a temperature controller configured to measure a temperature of the etchant and control the heater to maintain the etchant at the set temperature.

The etching device may further include a pressurization discharge line connecting the etching chamber to the pressurization storage unit.

The etching device may further include a pressurization opening/closing unit configured to selectively open or close the pressurization discharge line.

The etching device may further include a discharge line through which any one of the rinsing liquid and the etchant discharged from the etching chamber is discharged to the outside, and a discharge opening/closing unit configured to selectively open or close the discharge line.

The etching device may further include a rinsing liquid line connecting the rinsing liquid supply unit to the etching chamber, a cleaning liquid line connecting the cleaning liquid supply line to the etching chamber, a rinse opening/closing unit configured to selectively open or close the rinsing liquid line, and a cleaning opening/closing unit configured to selectively open or close the cleaning liquid line.

When a temperature of the etchant is less than or equal to a set temperature, the etchant supply unit may stop supply of the etchant to the etching chamber and heat the etchant to the set temperature.

Another aspect of the present invention provides an etching method including a loading operation of opening an etching chamber to place an object, a pressurization operation of pressurizing an inside of the etching chamber, an etching operation of supplying an etchant into the etching chamber to etch the object, a rinsing operation of supplying a rinsing liquid into the etching chamber to remove by-products and the etchant remaining on the object, a cleaning operation of supplying a cleaning liquid into the etching chamber to remove the rinsing liquid remaining on the object, and an unloading operation of opening the etching chamber to discharge the object to the outside.

The etching method may further include a heating operation of, when a temperature of the etchant is less than or equal to a set temperature, heating the etchant to the set temperature or a temperature higher than the set temperature.

In the heating operation, supply of the etchant to the etching chamber may be cut off and the etchant may be heated while circulating through a circulation line.

In the etching operation, a circulation line, a rinsing liquid line, and a cleaning liquid line may be closed, and the etchant may circulate through a supply liquid line, the etching chamber, and a recovery line to perform etching.

At least one of the rinsing operation and the cleaning operation may further include a discharge operation of closing a recovery line and discharging at least one of the rinsing liquid and the cleaning liquid to a pressurization storage unit.

In the discharge operation, at least one of the rinsing liquid and the cleaning liquid may be discharged while maintaining the pressurization storage unit in a pressurized atmosphere.

The etching method may further include a drying operation of drying the object in the unloading operation or before the unloading operation.

The etching method may further include a depressurization operation of discharging an internal pressure of the etching chamber to the outside before the unloading operation.

The etchant selectively uses at least one or a mixture of one or more of HF, $NHO_3$, $H_2O_2$, IPA, $NH_4OH$, $H_2O$, $H_3PO_4$, and $H_2SO_4$.

Advantageous Effects

In an etching device and an etching method thereof according to one embodiment of the present invention, by maintaining an inside of an etching chamber in a pressurized atmosphere during etching, vaporization can be prevented, a concentration of an etchant can be kept constant, and an etching selectivity can be improved.

In addition, since a concentration of the etchant is kept constant, additional deionized water and an additional input of the etchant are not required to maintain the concentration of the etchant. Accordingly, it is possible to improve a product yield and reduce consumption of the etchant, and in economic terms, cost can be greatly reduced.

In addition, since the etching is performed in a state where an object is immersed in the etchant, a thick liquid film of the etchant can be formed, and thus, it is possible to improve etching performance.

MODES OF THE INVENTION

Hereinafter, exemplary embodiments of the present invention will be described in detail with reference to the accompanying drawings.

Advantages and features of the present invention and a method of achieving these will become apparent with reference to the embodiments described below in detail together with the accompanying drawings.

However, the present invention is not limited to the embodiments disclosed below but will be implemented in a variety of different forms, only the present embodiments are provided to complete the disclosure of the present invention and to fully inform the scope of the invention to those skilled in the art to which the present invention pertains, and the present invention will be defined by the scope of the claims.

In addition, when it is determined that related well-known technologies or the like may obscure subject matters of the present invention in describing the present invention, detailed descriptions thereof will be omitted.

Figure 1:
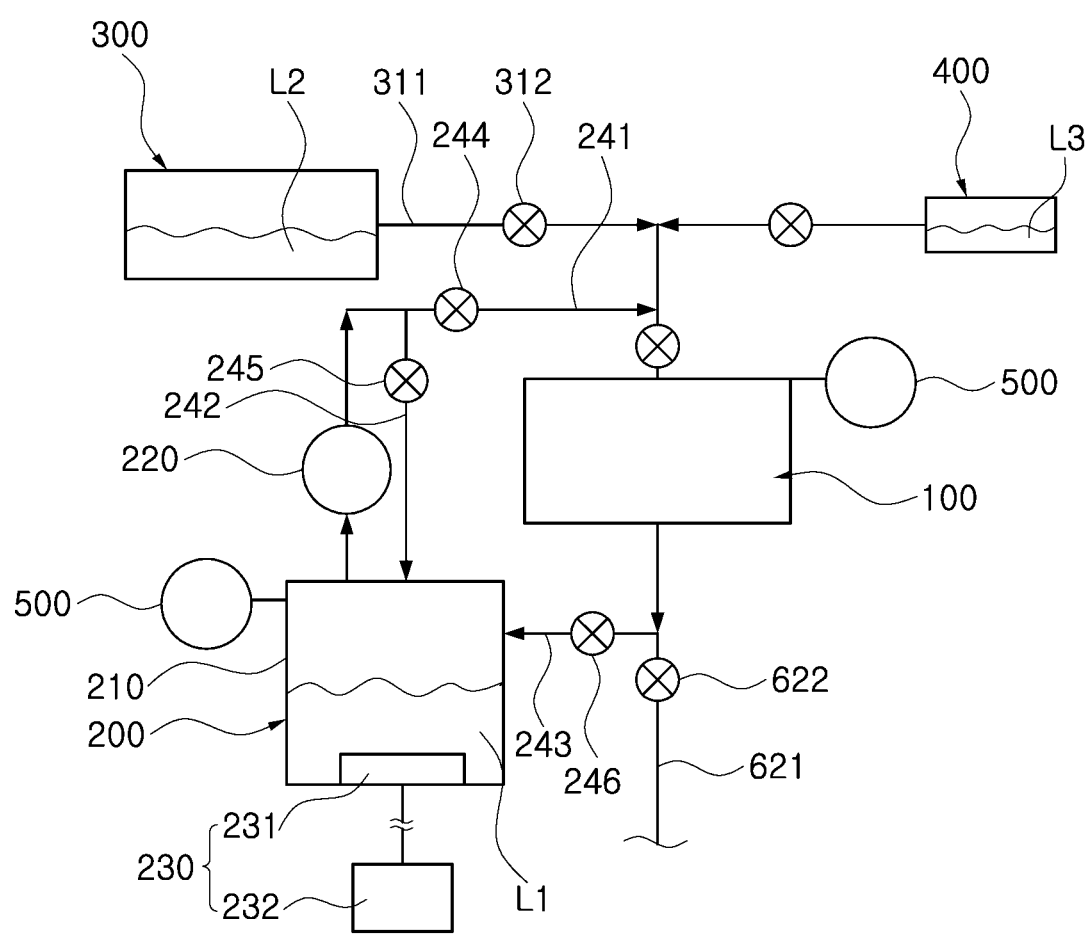
FIG. 1 is a diagram illustrating an etching device and an etching method thereof according to one embodiment of the present invention.
Figure 2:
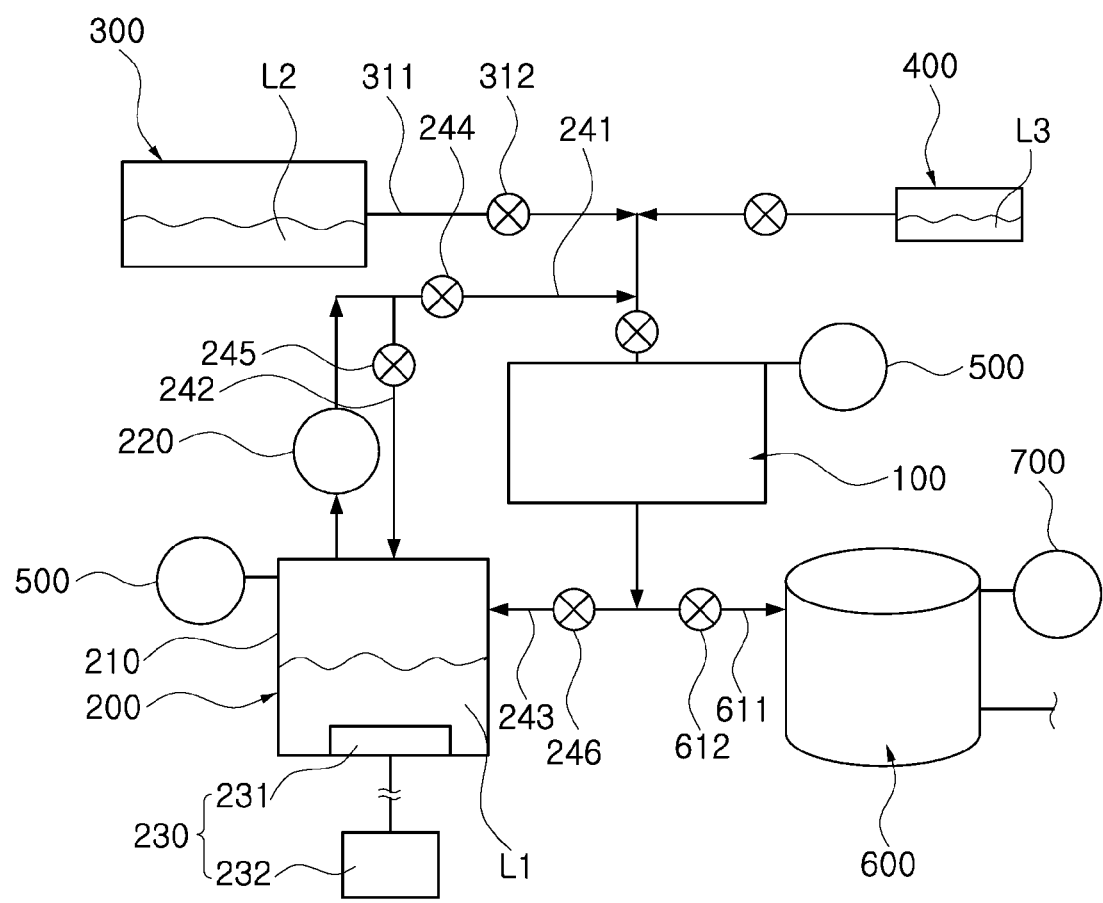
FIG. 2 is a diagram illustrating a state where a pressurization storage unit is applied to an etching device and an etching method thereof according to another embodiment of the present invention.

FIG. 1 is a diagram illustrating an etching device and an etching method thereof according to one embodiment of the present invention, and FIG. 2 is a diagram illustrating a state where a pressurization storage unit is applied to an etching device and an etching method thereof according to another embodiment of the present invention.

Referring to FIGS. 1 and 2, the etching device according to one embodiment of the present invention includes an etching chamber 100, an etchant supply unit 200, a rinsing liquid supply unit 300, a cleaning liquid supply unit 400, and a first pressurization maintaining unit 500.

The etching chamber 100 is provided to be openable or closable, an etchant (phosphoric acid: $H_3PO_4$ or the like) L1 at high temperature, a rinsing liquid (phosphoric acid: $H_3PO_4$ or the like) L2 at room temperature, and a cleaning liquid (water or the like) L3 may be selectively supplied to a pressure chamber inside the etching chamber 100. A pressurized atmosphere of the pressure chamber 101 may be maintained by the first pressurization maintaining unit 500.

In the etching device according to one embodiment of the present invention, the etchant L1 and the rinsing liquid L2 are not limited, and various types may be used. For example, the etchant L1 and rinsing liquid L according to one embodiment of the present invention may selectively use at least one or a mixture of one or more of HF, $NHO_3$, $H_2O_2$, IPA, $NH_4OH$, $H_2O$, $H_3PO_4$, and $H_2SO_4$.

The etching chamber 100 may include a first chamber and a second chamber provided to be openable or closable above the first chamber, and a mounting table for placing an etching object may be located inside the etching chamber 100.

A mounting table according to one embodiment of the present invention may use a method of fixing (chucking) an object using a chuck (not illustrated) after placing the object on a support pin (not illustrated).

Meanwhile, unlike the method of fixing (chucking) the object using the chuck after placing the object on the support pin of the mounting table (not illustrated), a mounting table according to another embodiment of the present invention may use a method of forming an etching performance improvement unit (not illustrated) on an upper surface of the mounting table to place the object thereon.

The etching performance improvement unit is recessed so that the object is placed in a state of being inserted and immersed in the etchant, the etching performance improvement unit may include a seating surface (not illustrated) that is formed along an edge of the etching performance improvement unit so that the object is placed thereon and protrusions (not illustrated) that are formed along the edge of the seating surface to accommodate the etchant above the object.

Moreover, the etching chamber 100 may include one or more inlets (not illustrated) through which the etchant L1, the rinsing liquid L2, and the cleaning liquid (SC1, DHF, IPA, DIW, or the like) L3 are supplied into the pressure chamber, and a discharge unit (not illustrated) for discharging the etchant L1, the rinsing liquid L2, and the cleaning liquid L3 to the outside may be formed in a lower portion of the etching chamber 100.

The etchant supply unit 200 supplies the etchant L1 to the etching chamber 100 at a high temperature, and the etchant supply unit 200 stops the supply of the etchant L1 to the etching chamber 100 when a temperature of the etchant L1 is less than or equal to a set temperature and heats the etchant L1 to the set temperature.

Here, the etchant supply unit 200 may include a storage chamber 210, a pumping unit 220, and a temperature maintaining unit 230. The storage chamber 210 stores the etchant L1, the pumping unit 220 is provided in a supply line 241 described below to move the etchant L1, and the temperature maintaining unit 230 maintains the etchant L1 stored in the storage chamber 210 at a set temperature.

The temperature maintaining unit 230 may include a temperature controller 232 which measures the temperatures of a heater 231 provided in the etching chamber 100 and the etchant L1 and controls driving of the heater 231 so that the etchant L1 is maintained at the set temperature. The heater 231 heats the etchant L1 accommodated in the etching chamber 100 to a set temperature, and the pumping unit 220 may transmit a pumping pressure in a state of being connected to the supply line 241.

In addition, the supply line 241 that connects the etchant supply unit 200 to the etching chamber 100, a circulation line 242 that connects the supply line 241 to the etchant supply unit 200, and a recovery line 243 through which the etchant L1 discharged from the etching chamber 100 is supplied to the etchant supply unit 200 may be provided.

In addition, a supply opening/closing unit 244 for selectively opening or closing the supply line 241, a circulation opening/closing unit 245 for selectively opening or closing the circulation line 242, and a recovery opening/closing unit 246 for selectively opening or closing the recovery line 243 may be provided.

The rinsing liquid supply unit 300 supplies the rinsing liquid L2 to the etching chamber 100 and may include a rinsing liquid line 311 that connects the rinsing liquid supply unit 300 to the etching chamber 100 and a rinse opening/closing unit 312 for selectively opening or closing the rinsing liquid line 311.

The cleaning liquid supply unit 400 supplies the cleaning liquid to the etching chamber 100 and may further include a cleaning liquid line 411 that connects the cleaning liquid supply unit 400 to the etching chamber 100 and a cleaning opening/closing unit 412 for selectively opening or closing the cleaning liquid line 411.

The first pressurization maintaining unit 500 maintains at least one of the etching chamber 100 and the etchant supply unit 200 in a pressurized atmosphere. In this case, one first pressurization maintaining unit 500 may collectively control the etching chamber 100 and the etchant supply unit 200, or the first pressurization maintaining unit 500 may be connected to each of the etching chamber 100 and the etchant supply unit 200 to control the etching chamber 100 and the etchant supply unit 200 individually.

Moreover, a pressurization storage unit 600 that accommodates at least one of the rinsing liquid L2 and the cleaning liquid L3 discharged from the etching chamber 100, and a second pressurization maintaining unit 700 that maintains the pressurization storage unit 600 in a pressurized atmosphere may be further provided.

As illustrated in FIG. 1, the etching device according to one embodiment of the present invention may further include a discharge line 621 through which at least one of the rinsing liquid L2 and the etchant L1 discharged from the etching chamber 100 is discharged to the outside and a discharge opening/closing unit 622 for selectively opening or closing the discharge line 621.

That is, any one of the rinsing liquid L2 and the etchant L1 discharged to the outside through an outlet of the etching chamber 100 may be discharged to the outside through the discharge line 621 after the discharge opening/closing unit 622 is opened.

Meanwhile, as illustrated in FIG. 2, an etching device according to another embodiment of the present invention may further include a pressurization discharge line 611 that connects the etching chamber 100 to the pressurization storage unit 600 and a pressurization opening/closing unit 612 for selectively opening or closing the pressurization discharge line 611.

That is, any one of the rinsing liquid L2 and the cleaning liquid L3 discharged to the outside through the outlet of the etching chamber 100 may be stored in the pressurization storage unit 600 through the pressurization discharge line 611 after the pressurization opening/closing unit 512 is opened, and any one of the rinsing liquid L2 and the etchant L1 stored in the pressurization storage unit 600 may be discharged to the outside in a state where the pressure of the pressurization storage unit 600 is discharged to the outside.

A process in which the etchant supply unit 200 supplies the etchant L1 will be described. The supply opening/closing unit 244 and the recovery opening/closing unit 246 are opened and the etchant L1 at high temperature is supplied to the inlet of the etching chamber 100 through the supply line 241, and the etchant L1 discharged through the outlet of the etching chamber 100 is moved to the etchant supply unit 200 through the recovery line 243.

At the same time, the circulation opening/closing unit 245, the rinse opening/closing unit 312, and the cleaning opening/closing unit 412 are closed, and the discharge opening/closing unit 622 or the pressurization opening/closing unit 62 is closed. In this case, the circulation line 242, the rinsing liquid line 311, and the cleaning liquid line 411 are closed, and the discharge line 621 or the pressurization discharge line 611 is closed.

In this process, when the temperature of the etchant L1 is less than or equal to the set temperature, the etchant supply unit 200 stops the supply of the etchant L1 to the etching chamber 100 and heats the etchant L1 to the set temperature.

When the temperature of the etchant L1 is less than or equal to the set temperature, the etchant supply unit 200 opens the circulation opening/closing unit 245 to circulate the etchant L1 along the circulation line 242 and closes the supply opening/closing unit 244 and the recovery opening/closing unit 246.

In this state, the etchant L1 is circulated only through a partial section of the supply line 241 connecting the supply opening/closing unit 244 and the storage chamber 210 and the circulation line 242, and the etchant L1 is heated by the heater 231 until the etchant L1 reaches the set temperature.

Thereafter, when the temperature of the etchant L1 reaches the set temperature, the supply opening/closing unit 244 and the recovery opening/closing unit 246 are opened, the etchant L1 at high temperature is supplied to the inlet of the etching chamber 100 through the supply line 241, and the etchant L1 discharged to the outlet of the etching chamber 100 is moved to the etchant supply unit 200 through the recovery line 243.

That is, when the temperature of the etchant L1 is less than or equal to the set temperature in the process of supplying the etchant L1 by the etchant supply unit 200, the etching process is stopped and the etchant L1 circulates to be heated to the set temperature, and thus, the etchant L1 may be maintained at a temperature suitable for the process.

A process in which the rinsing liquid supply unit 300 supplies the rinsing liquid L2 will be described. The rinse opening/closing unit 312 is opened to supply the rinsing liquid L2 at room temperature to the inlet of the etching chamber 100 through the rinsing liquid line 311, and the discharge opening/closing unit 622 or the pressurization opening/closing unit 612 is opened.

At the same time, the supply opening/closing unit 244, the recovery opening/closing unit 246, the circulation opening/closing unit 245, and the cleaning opening/closing unit 412 are closed. In this case, the supply line 241, the recovery line 243, the circulation line 242, and the cleaning liquid line 411 are closed.

In this process, the rinsing liquid L2 discharged to the outside through the outlet of the etching chamber 100 may be discharged to the outside through the discharge line 621 or stored in the pressurization storage unit 600 through the pressurization discharge line 611.

A process in which the cleaning liquid supply unit 400 supplies the cleaning liquid L3 will be described. The cleaning opening/closing unit 412 is opened to supply the cleaning liquid L3 to the inlet of the etching chamber 100 through the cleaning liquid line 411, and as in the process of supplying the rinsing liquid L2, the discharge opening/closing unit 622 or the pressurization opening/closing unit 612 is opened.

At the same time, the supply opening/closing unit 244, the recovery opening/closing unit 246, the circulation opening/closing unit 245, and the cleaning opening/closing unit 412 are closed. In this case, the supply line 241, the recovery line 243, the circulation line 242, and the cleaning liquid line 411 are closed.

In this process, the cleaning liquid L3 discharged to the outside through the outlet of the etching chamber 100 may be discharged to the outside through the discharge line 621 or stored in the pressurization storage unit 600 through the pressurization discharge line 611.

Hereinafter, an etching method according to one embodiment of the present invention will be described as follows, configurations which are the same as the above-described configurations will not be described repeatedly.

The etching method according to one embodiment of the present invention includes a loading operation of opening the etching chamber to place the object (substrate, or the like), a pressurization operation of pressurizing the inside of the etching chamber, an etching operation of supplying the etchant into the etching chamber to etch the object, a rinsing operation of supplying the rinsing liquid into the etching chamber to remove by-products and the etchant remaining on the object, a cleaning operation of supplying the cleaning liquid into the etching chamber to remove the rinsing liquid remaining on the object, and an unloading operation of opening the etching chamber to discharge the object to the outside.

The loading operation is a process of placing the object inside the etching chamber 100. In the loading operation, after the etching chamber 100 is opened, the object may be placed in the etching chamber 100.

In the pressurization operation, after the etching chamber 100 is closed, the first pressurization maintaining unit 500 is driven to supply gas ($N_2$ or the like) to the pressure chamber of the etching chamber 100 to pressurize the pressure chamber of the etching chamber 100 to the set pressure.

In the etching operation, the etchant supply unit 200 is driven to spray the etchant L1 at high temperature through the inlet of the etching chamber 100. In this case, in the etching operation, the supply opening/closing unit 244 and the recovery opening/closing unit 246 are opened to supply the etchant L1 at high temperature to the inlet of the etching chamber 100 through the supply line 241, and the etchant L1 discharged through the outlet of the etching chamber 100 is moved to the etchant supply unit 200 through the recovery line 243.

At the same time, the circulation opening/closing unit 245, the rinse opening/closing unit 312, and the cleaning opening/closing unit 412 are closed, and the discharge opening/closing unit 622 or the pressurization opening/closing unit 612 is closed. In this case, the circulation line 242, the rinsing liquid line 311, and the cleaning liquid line 411 are closed, and the discharge line 621 or the pressurization discharge line 611 is closed.

In the etching operation, the circulation line 242, the rinsing liquid line 311, and the cleaning liquid line 411 are closed, and the etchant L1 is circulated through the supply line 241, the etching chamber 100, and the recovery line 243 to perform the etching.

Meanwhile, when the temperature of the etchant is less than or equal to the set temperature, a heating operation of heating the etchant to the set temperature or a temperature higher than the set temperature may be further provided. In the heating operation, the supply of the etchant L1 to the etching chamber 10 may be cut off and the etchant L1 may be heated while circulating through the circulation line 242.

In more detail, in the heating operation, when the temperature of the etchant L1 is less than or equal to the set temperature, the circulation opening/closing unit 245 is opened to circulate the etchant L1 along the circulation line 242, and the supply opening/closing unit 244 and the recovery opening/closing unit 246 are closed.

In this state, the etchant L1 is circulated only through a partial section of the supply line 241 connecting the supply opening/closing unit 244 to the storage chamber 210 and the circulation line 242, and the etchant L1 is heated by the heater 231 until the etchant L1 reaches the set temperature.

Thereafter, when the temperature of the etchant L1 reaches the set temperature, the supply opening/closing unit 244 and the recovery opening/closing unit 246 are opened, the etchant L1 at high temperature is supplied to the inlet of the etching chamber 100 through the supply line 241, and the etchant L1 discharged to the outlet of the etching chamber 100 is moved to the storage chamber 210 of the etchant supply unit 200 through the recovery line 243.

That is, when the temperature of the etchant L1 is less than or equal to the set temperature in the process of supplying the etchant L1 by the etchant supply unit 200, the etching process is stopped, and the etchant L1 circulates to be heated to the set temperature, and thus, the etchant L1 may be maintained at a temperature suitable for the process.

The rinsing operation is a process of driving the rinsing liquid supply unit 300 to supply the rinsing liquid L2 into the etching chamber 100 and clean the object. In the rinsing operation, a rinsing liquid (phosphoric acid: $H_3PO_4$ or the like) at room temperature is supplied through the inlet of the etching chamber 100 to cool the object for a certain period of time, and the by-products and etchant L1 remaining on the object are removed.

In this case, in the rinsing operation, the rinse opening/closing unit 312 is opened to supply the rinsing liquid L2 at room temperature to the inlet of the etching chamber 100 through the rinsing liquid line 311, and the supply opening/closing unit 244, the recovery opening/closing unit 246, the circulation opening/closing unit 245, and the cleaning opening/closing unit 412 are closed. In this case, the supply line 241, the recovery line 243, the circulation line 242, and the cleaning liquid line 411 are closed.

The cleaning operation is a process of driving the cleaning liquid supply unit 400 to supply the cleaning liquid (water or the like) L3 through the inlet of the etching chamber 100 and clean the object. In this case, in the cleaning operation, the cleaning opening/closing unit 412 is opened to supply the cleaning liquid L3 to the inlet of the etching chamber 100 through the cleaning liquid line 411.

In addition, at least one of the rinsing operation and the cleaning operation may further include a discharge operation of closing the recovery line 243 and discharging at least one of the rinsing liquid L2 and the cleaning liquid L3 to the pressurization storage unit 600.

Here, in the discharge operation, the discharge opening/closing unit 622 or the pressurization opening/closing unit 612 is opened, and the supply opening/closing unit 244, the recovery opening/closing unit 246, and the circulation opening/closing unit 245 are closed. In this case, the supply line 241, the recovery line 243, and the circulation line 242 are closed.

In this process, the cleaning liquid L3 discharged to the outside through the outlet of the etching chamber 100 may be discharged to the outside through the discharge line 621 or stored in the pressurization storage unit 600 through the pressurization discharge line 611. In this case, at least one of the rinsing liquid L2 and the cleaning liquid L3 may be discharged while maintaining the pressurization storage unit 600 in a pressurized atmosphere.

The unloading operation is a process of discharging the object to the outside and may further include a drying operation of drying the object in the unloading operation or before the unloading. Before the unloading operation, a decompression operation of discharging the internal pressure of the etching chamber 100 to the outside may be further provided.

A drying method in the drying operation may be applied in various ways as needed, and in the drying operation and the cleaning operation, the pressure chamber of the etching chamber 100 may be maintained in the pressurized atmosphere, or the internal pressure of the pressure chamber may be exhausted to the outside so that the cleaning and drying may be performed under an atmospheric pressure.

In the depressurization operation, the pressure in the pressure chamber is discharged to the outside by driving an exhaust unit (not illustrated), and the pressure chamber may be maintained at the atmospheric pressure by the pressure being discharged from the exhaust unit.

Heretofore, the specific embodiments of the etching device and the etching method thereof according to the present invention are described, but it is obvious that various implementation modifications are possible within a limit not departing from a scope of the present invention.

Therefore, the scope of the present invention is not limited to the described embodiments and should be determined by claims and equivalents to the claims to be described below.

That is, it should be understood that the above-described embodiments are illustrative in all respects and not limiting, and the scope of the present invention is indicated by the claims to be described below rather than the detailed description, and all changes or modifications derived from the meaning and scope of the claims and their equivalent concepts should be construed as being included in the scope of the present invention.

The invention claimed is:

1. An etching device comprising:
    an etchant supply container configured to provide an etchant to an etching chamber in which an object is placed;
    a rinsing liquid supply container configured to provide a rinsing liquid to the etching chamber;
    a cleaning liquid supply container configured to provide a cleaning liquid to the etching chamber;
    a first pressurizer configured to maintain the etching chamber and the etchant supply container in a pressurized atmosphere;
    a pressurization storage container configured to accommodate the rinsing liquid and the cleaning liquid discharged from the etching chamber;
    a second pressurizer configured to maintain the pressurization storage container in the pressurized atmosphere; and
    a supply line connecting the etchant supply container to the etching chamber;
    wherein the etchant supply container includes:
        a storage chamber in which the etchant is stored; and
        a temperature regulator configured to maintain the etchant stored in the storage chamber at a set temperature.

2. The etching device of claim 1, further comprising:
    a circulation line connecting the supply line to the etchant supply container; and
    a recovery line configured to supply the etchant discharged from the etching chamber to the etchant supply container.

3. The etching device of claim 2, further comprising:
    a supply opening/closing valve configured to selectively open or close the supply line;
    a circulation opening/closing valve configured to selectively open or close the circulation line; and
    a recovery opening/closing valve configured to selectively open or close the recovery line.

4. The etching device of claim 2, wherein the etchant supply container further includes:
a pump provided in the supply line to move the etchant, wherein:
in an etching process of the object, the etchant circulates through the supply line, the etching chamber, and the recovery line, and the object is etched, and
when a temperature of the etchant is less than or equal to the set temperature during an etchant supply process of the etchant supply container, the etching process is stopped, and the etchant is circulated through the circulation line and heated until the etchant reaches the set temperature.

5. The etching device of claim 4, wherein the temperature regulator includes:
a heater provided in the storage chamber; and
a temperature controller configured to measure a temperature of the etchant and control the heater to maintain the etchant at the set temperature.

6. The etching device of claim 1, further comprising a pressurization discharge line connecting the etching chamber to the pressurization storage container.

7. The etching device of claim 6, further comprising a pressurization opening/closing valve configured to selectively open or close the pressurization discharge line.

8. The etching device of claim 7, wherein the pressurization opening/closing valve is disposed along the pressurization discharge line and interposed between the etching chamber and the pressurization storage container, and is configured to discharge the rinsing liquid and the cleaning liquid from the etching chamber to the pressurization storage container while maintaining the same pressure.

9. The etching device of claim 1, further comprising:
a discharge line through which any one of the rinsing liquid and the etchant discharged from the etching chamber is discharged to the outside; and
a discharge opening/closing valve configured to selectively open or close the discharge line.

10. The etching device of claim 1, further comprising:
a rinsing liquid line connecting the rinsing liquid supply container to the etching chamber;
a cleaning liquid line connecting the cleaning liquid supply container to the etching chamber;
a rinse opening/closing valve configured to selectively open or close the rinsing liquid line; and
a cleaning opening/closing valve configured to selectively open or close the cleaning liquid line.

* * * * *